Dec. 21, 1965 L. E. A. SUMMERS ETAL 3,224,072

METHOD OF FORMING AN ELECTRICAL CONNECTION TO AN INSULATING BASE

Filed Dec. 27, 1962

Inventors
Leo Ewart Arthur Summers
Roger John Horwood
By
Bailey Stephens & Huettig
Attorneys

United States Patent Office 3,224,072

Patented Dec. 21, 1965

3,224,072

METHOD OF FORMING AN ELECTRICAL CONNECTION TO AN INSULATING BASE

Leo Ewart Arthur Summers, Rosedale, Fosse Lane, Nailsea, Somerset, and Roger John Horwood, Inglenook, Shoscombe, near Bath, Somerset, England, assignors to Bristol Aircraft Limited, Bristol, England, a British company Filed Dec. 27, 1962, Ser. No. 247,660
Claims priority, application Great Britain, Jan. 5, 1962, 553/62
7 Claims. (Cl. 29—155.5)

Figure 1:
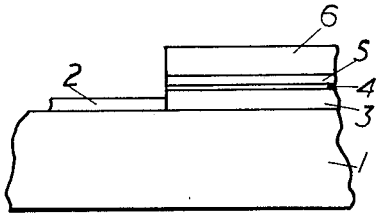

It is known to produce a miniature electrical circuit by depositing onto an insulating base lines of conductive material which serve to connect electrical components to each other or to other components, which may be external to the insulating base. It is also known to form resistors on the base by depositing areas of resistive material and to produce other components of such a circuit by the deposition of materials which have the requisite electrical properties. In one such known method, the insulating base is first masked so that only a pattern of the base material corresponding to that required for the resistive material is exposed and the masked insulating base is then placed under a sealed dome in a vacuum deposition machine. When the dome has been evacuated a small quantity of the resistive material in the form of wire or fine powder is heated by electrical means so that it evaporates and is deposited on the base. When the base is taken out of the machine and the mask is removed, the base is left with the required areas of deposited resistive material. A fresh mask is then placed over the base leaving an exposed pattern corresponding to that required for the conductive material and the process of evaporation and deposition is repeated with the conductive material, which may be copper. When the mask is removed the insulating base has on its surface resistive and conductive materials which together form the required pattern of resistors and conductors. The method just described may be adapted to form other deposited components; for example capacitors may be formed by depositing alternate layers of conductive and dielectric material. To connect the insulating base to other components fine copper leads are connected by soldering to the deposited conductive elements. However, the mechanical strength of such joints is limited by poor adhesion of the deposited conductive layer to the base. Also a soldered joint is bulky and difficult to make and may need an active flux.

According to the invention, to improve the adhesion of an element of highly conductive metal there is deposited on the insulating base in a vacuum chamber a primary layer of a metal which is different from the highly conductive metal and which is such that it will provide good bonds both between itself and the highly conductive metal and then depositing on the primary layer by vacuum deposition at least three layers of the highly conductive metal, the temperature of the base being reduced for the depositing of each successive layer of the said highly conductive metal and the deposition of each successive layer of highly conductive metal being continued until it is thicker than the preceding one.

The base material upon which the conductive and resistive elements are deposited is preferably glass. Conductive elements in miniature electrical circuits are conveniently gold, copper, or silver. However, poor adhesion is obtained with direct deposition of, for example, gold on glass. There are several metals which, when used in this way, give excellent adhesion to glass and other base materials with similar surface properties and these may be used for the primary layer. These metals include Nichrome (an 80/20 nickel-chromium alloy with or without further alloying elements), chromium, iron and nickel.

According to a subsidiary feature of the invention, the need for soldering is removed by bonding a connecting lead to the deposited conductive elements by the application of heat and pressure, the bonding being effected in a stream of hot inert gas. Preferably the base is heated by the hot inert gas before the bonding operation is begun.

Figure 2:
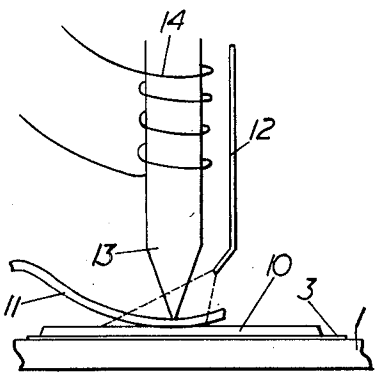

In order that the invention may be more clearly understood an example will now be described with reference to the accompanying drawings, in which:

FIGURE 1 illustrates diagrammatically the completed conductive elements on the insulating base; and FIGURE 2 illustrates the method of joining a connecting lead to the conductive element.

In this example a glass base, 1 mm. thick, was first masked to expose only the pattern of the required resistive material, and then placed in a sealed dome connected to a vacuum pump and provided with heating means to maintain the base at an elevated temperature and to heat the material to be evaporated and deposited. The upper limit of temperature to which the base may be heated will be determined by the physical properties of the base material, the temperature being such as not to adversely affect the material. With the dome evacuated to approximately $10^{-5}$ mm. Hg, the glass base was heated to 300° C. and the Nichrome source was heated to approximately 1600° C., i.e. to a temperature at which it vaporises and is deposited on the base. When the layer of Nichrome reached 75 A. in thickness, the coated base was taken out of the dome and the mask removed. The thickness of the layer of resistive material deposited will depend on the resistance value required and thus on the pecific resistivity of the material used.

Next, to deposit the required conductive elements on the base a second mask having apertures corresponding to the required conductive areas was placed over the glass base and the masked base was again placed in the evacuated dome. Nichrome was again deposited, this time to a thickness of about 200 A., with the glass base again heated to 300° C. The base now had a primary layer of deposited Nichrome elements 200 A. thick corresponding to the required conductive member, connecting the deposited resistive members which were also Nichrome but only about 75 A. thick.

Next a gold wire was heated in the evacuated dome to deposit a layer of gold approximately 50 A. onto the Nichrome primary layer, the mask being the same as that used to deposit the Nichrome primary layer. Again the glass temperature was maintained at 300° C.

A second gold layer of thickness approximately 150 A. was deposited on the first gold layer with the glass base at 150° C. and finally a third gold layer of thickness approximately 1500 A. was deposited on the second gold layer with the glass base at room temperature (about 20° C.).

The final structure is illustrated in FIGURE 1, in which the thickness of the layers are greatly exaggerated for the sake of clarity. Deposited on the base 1 are the Nichrome layer 2 constituting the resistive element and the Nichrome layer 3 constituting the primary layer of the conductive element. On the primary layer there are superimposed three gold layers 4, 5 and 6 of increasing thicknesses which together provide the highly conductive connector.

Generally speaking, if the resistive material is Nichrome, the thickness of the resistive layer should not be less than about 70–80 angstrom units (A.) and the deposition temperature may be between 300° and 350° C. If the primray layer to be deposited is Nichrome it is convenient to use the same temperature and the same source of material to be evaporated. The thickness of the deposit may be up to 300 A. If however iron is used for the primary layer the thickness need only be 75 A. units. If three layers of conductive material in gold are used the thickness and deposition temperatures are preferably within the following ranges:

The first layer 50–150 A. units in thickness and at 280°–320° C.;
The second layer 150–500 A. in thickness and at 130°–150° C.; and
The third layer 1000–2000 A. or more in thickness and below 75° C.

It is important that the first conducting layer should be fairly thin, both to promote firm adhesion to the base and because, if it is too thick, there may be a tendency to blooming of the shiny surface of the deposited conductive material, which will interfere with the adhesion of the next layer.

The conductor leads to be affixed to the conductive areas of the circuit may be connected on to these areas on the base by thermo-compression bonding, that is, by the application of heat and pressure to the bond area. Hitherto, similar bonds have been made by soldering, since if the leads had been simply bonded to the conductive strips, the poor adhesion hitherto obtained by depositing, say, gold on glass, would have resulted in the conductive area tending to peel off when the lead was attached. However, now that good adhesion is possible according to the present invention, this method of bonding can be used to give truly satisfactory results.

This method is illustrated in FIGURE 2 of the drawings in which the layer 10 representing the three superimposed layers of gold is to be connected to a gold conductor 11. A jet of heated inert gas, such as for example nitrogen, is led to the area of the joint through fine capillary tubing 12 and is blown over the required area to preheat it.

This prevents the production of high temperature gradients and the consequent cracking of the glass insulating base when the heating tool 13 is applied to it. This heating tool is a rod which is electrically heated by means of a coil 14 and which has a wedge-shaped working end which is used to press the gold conductor lead against the gold conductive layer and to heat the area of the joint. The heated inert gas continues to flow over the area during heating and forms a shield to prevent oxidation of the sub-layers. Using a 36 S.W.G. gold wire, the heating tool is conveniently applied with a load of 6 lbs. for 6 seconds at 350° C. and is then removed, leaving the gold conductor lead bonded to the gold conductive layer. The gauge size of the gold conductor lead will determine the load applied and the period of application.

It has been found that by building up the gold layers in the manner described above, the composite gold layer has good adhesion to the insulating base and the individual layers have good adhesion to each other. In addition, the composite gold layer enables a strong bonded joint to be made.

We claim:

1. A method of forming on an insulating base an element of a metal of high electrical conductivity comprising the steps of depositing on the base in a vacuum chamber a primary layer of a metal different from said highly conductive metal and which will provide good bonds both between itself and the material of the base and between itself and said highly conductive metal, then depositing on said primary layer by vacuum deposition at least three layers of said highly conductive metal, the temperature of the base being reduced for the depositing of each successive layer of said highly conductive metal and the deposition of each successive layer of highly conductive metal being continued until it is thicker than the preceding one.

2. A method of forming on an insulating base an element of gold comprising the steps of depositing on the base in a vacuum chamber a primary layer of a different metal which will provide good bonds both between itself and the material of the base and between itself and gold, then depositing on said primary layer by a vacuum deposition method comprising the evaporation of a gold source at least three layers of gold, the temperature of the base being reduced for the depositing of each successive layer of gold and the deposition of each successive layer of gold being continued until it is thicker than the preceding one.

3. A method according to claim 2, in which the final layer of gold is deposited with the base substantially at room temperature.

4. A method according to claim 2, in which the primary layer is selected from the group consisting of nickel, chromium, alloys of these metals and iron.

5. A method according to claim 4, including the step of depositing resistive elements on said insulating base and in which Nichrome is used for the primary layer and is also used as the metal for said resistive elements.

6. A method of forming on a glass base an element of gold comprising the steps of depositing on the base in a vacuum chamber a layer of a primary metal selected from the group consisting of nickel, chromium, nickel-chromium alloys and iron, then depositing on said primary layer by a vacuum deposition method comprising the evaporation of a gold source at least three layers of gold, the temperature of the base being reduced for the depositing of each successive layer of gold and the deposition of each successive layer of gold being continued until it is thicker than the preceding one.

7. A method of forming on an insulating base an element of gold and of connecting a gold wire thereto, comprising the steps of depositing on the base in a vacuum chamber a primary layer of a different metal which will provide good bonds both between itself and the material of the base and between itself and gold, then depositing on said primary layer by a vacuum deposition method comprising the evaporation of a gold source at least three layers of gold, the temperature of the base being reduced for the depositing of each successive layer of gold and the deposition of each successive layer of gold being continued until it is thicker than the preceding one, preheating the insulating base with a stream of hot inert gas and bonding the gold wire to the top layer of the deposited gold element by the application of heat and pressure in the presence of the hot inert gas.

References Cited by the Examiner

UNITED STATES PATENTS 2,220,545 11/1940 Reinhardt.

FOREIGN PATENTS 846,559 8/1960 Great Britain.
874,965 8/1961 Great Britain.

OTHER REFERENCES

"Electrical Contact With Thermo-Compression Bonds" (Christensen), Bell Laboratories Record, April 1958, (pages 127–130 relied on).

JOHN F. CAMPBELL, *Primary Examiner.*